(12) United States Patent
Petrmichl et al.

(10) Patent No.: US 7,455,883 B2
(45) Date of Patent: *Nov. 25, 2008

(54) HYDROPHILIC DLC ON SUBSTRATE WITH FLAME PYROLYSIS TREATMENT

(75) Inventors: Rudolph Hugo Petrmichl, Ann Arbor, MI (US); Joseph M. Bienkiewicz, Ann Arbor, MI (US); Scott V. Thomsen, South Lyon, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 784 days.

This patent is subject to a terminal disclaimer.

(21) Appl. No.: 10/967,342

(22) Filed: Oct. 19, 2004

(65) Prior Publication Data

US 2006/0083853 A1  Apr. 20, 2006

(51) Int. Cl.
  *B05D 3/08* (2006.01)
  *B05D 5/06* (2006.01)
(52) U.S. Cl. .............. 427/224; 427/162; 427/163.1; 427/331; 427/337; 427/902
(58) Field of Classification Search ............ 427/162, 427/163.1, 224, 331, 337, 902
  See application file for complete search history.

(56) References Cited

U.S. PATENT DOCUMENTS

| 3,883,336 | A | 5/1975 | Randall |
|---|---|---|---|
| 4,600,390 | A | 7/1986 | Gobel et al. |
| 4,620,988 | A | 11/1986 | Garschke et al. |
| 5,652,021 | A | 7/1997 | Hunt et al. |
| 5,958,361 | A | 9/1999 | Laine et al. |
| 6,277,480 | B1 | 8/2001 | Veerasamy et al. |
| 6,284,377 | B1 | 9/2001 | Veerasamy |
| 6,303,225 | B1 | 10/2001 | Veerasamy |
| 6,387,346 | B1 | 5/2002 | Bertsch-Frank et al. |
| 6,447,891 | B1 | 9/2002 | Veerasamy et al. |
| 6,461,731 | B1 | 10/2002 | Veerasamy et al. |
| 6,472,017 | B2 | 10/2002 | Veerasamy et al. |
| 6,475,573 | B1 | 11/2002 | Veerasamy et al. |
| 6,592,992 | B2 | 7/2003 | Veerasamy |
| 6,592,993 | B2 | 7/2003 | Veerasamy |
| 6,610,360 | B2 | 8/2003 | Petrmichl et al. |
| 6,660,340 | B1 | 12/2003 | Kirkpatrick |
| 6,665,033 | B2 | 12/2003 | Callegari et al. |
| 6,706,363 | B2 | 3/2004 | Honda et al. |
| 6,713,179 | B2 | 3/2004 | Veerasamy |
| 6,793,979 | B2 | 9/2004 | Veerasamy |
| 2003/0118828 | A1 | 6/2003 | Briand et al. |
| 2004/0067363 | A1 | 4/2004 | Bienkiewicz et al. |
| 2006/0246218 | A1* | 11/2006 | Bienkiewicz et al. ..... 427/249.1 |

* cited by examiner

*Primary Examiner*—Timothy H Meeks
*Assistant Examiner*—David Turocy
(74) *Attorney, Agent, or Firm*—Nixon & Vanderhye P.C.

(57) ABSTRACT

A substrate is coated with a layer(s) or coating(s) that includes, for example, amorphous carbon in a form of diamond-like carbon (DLC). The DLC is then subjected to flame pyrolysis in order to cause the contact angle θ thereof to decrease.

35 Claims, 7 Drawing Sheets

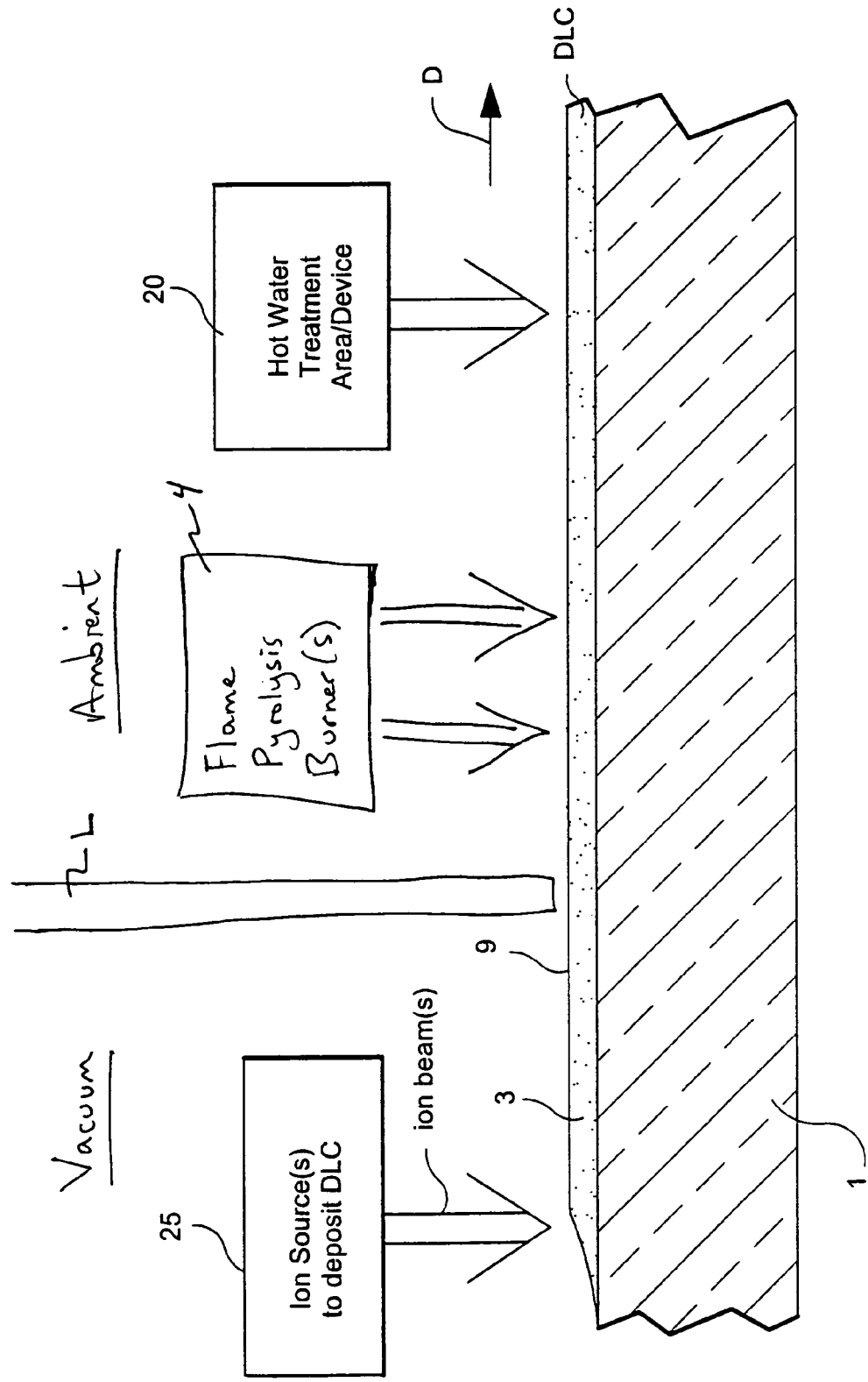

HYDROPHILIC DLC ON SUBSTRATE WITH FLAME PYROLYSIS TREATMENT

Certain example embodiments of this invention relate to a hydrophilic coating including diamond-like carbon (DLC) provided on (directly or indirectly) a substrate of glass, plastic, or the like, and a method of making the same. More particularly, this invention relates to a DLC inclusive coating that is treated using flame pyrolysis in order to cause the DLC inclusive coating to become hydrophilic and/or to reduce its contact angle $\theta$. Optionally, the DLC inclusive coating may also be treated with an ion beam including oxygen, and/or hot water (e.g., hot water in liquid and/or vapor form) also in order to cause the DLC inclusive coating to become hydrophilic and/or to reduce its contact angle $\theta$.

BACKGROUND OF THE INVENTION

It is often desirable to provide a hydrophilic coating (e.g., anti-fog coating) on a substrate such as an automotive windshield, automotive window, automotive mirror, architectural mirror, bathroom mirror, architectural window, or the like. Such coatings may reduce the likelihood of water drops deposited on the substrate taking globular shape(s), thereby permitting visibility to be improved. In other words, hydrophilic coatings function to reduce bead-like condensation on substrate surfaces (e.g., on the interior surface of an automotive windshield or window, IG window unit, or the like). In essence, a hydrophilic coating can reduce the formation of many tiny droplets of liquid which can scatter light on a surface (i.e., make condensation on a surface film-wise as opposed to droplet-wise).

Unfortunately, certain hydrophilic coatings are not as durable and/or hard as would otherwise be desired and thus are not efficient from a practical point of view for applications such as automotive windshields and/or other types of windows or U.S. Pat. No. 6,713,179, hereby incorporated herein by reference, discloses a layer comprising diamond-like carbon (DLC) that is treated with ultraviolet (UV) radiation in order to cause it to become hydrophilic (i.e., the UV exposure causes the contact angle $\theta$ of the layer to decrease). While this process of making a hydrophilic DLC inclusive layer works well, it takes much time. The example in U.S. Pat. No. 6,713,179 states that the DLC was treated with QUV for 86 hours in order to cause the contact angle $\theta$ of the DLC to drop from 73.47 degrees to 19.12 degrees (i.e., this contact angle reduction of 74% took 86 hours). It would be desirable if a DLC inclusive layer could be made to be hydrophilic via a less time-consuming process.

U.S. Patent Document 2004/0067363 discloses treating DLC with an ion beam and hot water in order to cause contact angle $\theta$ to be reduced. In such systems, the ion beam treatment is often performed as the last vacuum step in a coater or the like, and subsequent exposure to hot water can be performed in an exit bath. However, since vacuum space is valuable and capital intensive, and it would be desirable if a system for causing contact angle $\theta$ of DLC to be reduced could be developed which could optionally be performed in an ambient atmosphere where no vacuum is required.

In view of the above, it is apparent that there exists a need in the art for one or more of (i) a coated article (e.g. coated glass or plastic substrate) having hydrophilic properties, and/or a method of making the same, (ii) a protective hydrophilic coating for window and/or mirror substrates that is somewhat resistant to scratching, damage, (iii) a technique for causing contact angle $\theta$ of DLC to be reduced which may be performed in an ambient atmosphere where no vacuum is required, and/or (iv) a process for reducing a contact angle of DLC in a less time-consuming manner.

It is a purpose of different embodiments of this invention to fulfill any or all of the above described needs in the art, and/or other needs which will become apparent to the skilled artisan once given the following disclosure.

SUMMARY OF THE INVENTION

In certain example embodiments of this invention, there is provided a durable coated article that is less likely to attract or be affected by bead-like liquid condensation. Exemplary applications to which such hydrophilic coating(s) may be applied include, for example without limitation, automotive windshields, automotive backlites (i.e., rear vehicle windows), automotive side windows, architectural windows, mirrors, coated glass used for table furniture, etc.

In certain example instances, a layer comprising diamond-like carbon (DLC) is subjected to at least a flame pyrolysis treatment. Surprisingly, it has been found that the flame pyrolysis treatment causes the contact angle $\theta$ of the DLC inclusive layer to drop/decrease in a relatively short period of time. In certain example embodiments, the layer comprising DLC may additionally be treated with an ion beam(s) including oxygen, and/or a hot liquid and/or vapor such as hot water in order to cause the contact angle of the layer comprising DLC to also decrease in a relatively short period of time.

In certain example embodiments, it has been found that the flame pyrolysis treatment of a DLC inclusive layer oxidizes the surface of the DLC inclusive layer thereby causing its contact angle $\theta$ to quickly drop in a short period of time. In certain example embodiments, a bank of one or more flame pyrolysis burners may be used for treating the DLC inclusive layer.

Due to the provision of the DLC in certain example instances, a scratch resistant hydrophilic coating may be provided.

In certain example embodiments of this invention, there is provided a coated article, wherein a layer of the coating includes both $sp^2$ and $sp^3$ carbon-carbon bonds and has a surface energy $\gamma_c$ of at least about 20 mN/m, more preferably at least about 24 mN/m, and most preferably at least about 26 mN/m.

Certain example embodiments of the instant invention provide a method of making a coated article, the method comprising: depositing a layer comprising diamond-like carbon (DLC) on a substrate; after said depositing, subjecting the layer comprising DLC to a flame pyrolysis treatment in order to reduce a contact angle $\theta$ of the layer comprising DLC.

In certain other example embodiments of this invention, there is provided a method of making a coated article, the method comprising forming a layer on a substrate; and subjecting the layer to a flame pyrolysis treatment in order to reduce a contact angle $\theta$ of the layer. In certain example instances, the layer may comprise diamond-like carbon or any other suitable material.

This invention will now be described with respect to certain embodiments thereof, along with reference to the accompanying illustrations.

IN THE DRAWINGS

FIG. 2 is a side cross sectional view of a coated article according to another example embodiment of this invention, wherein a substrate is provided with at least a layer of or including DLC thereon and is subjected to a flame pyrolysis treatment and optional hot water (in liquid and/or vapor form) treatment in order to cause the layer's contact angle θ to decrease.

DETAILED DESCRIPTION OF CERTAIN EXAMPLE EMBODIMENTS OF THIS INVENTION

Figure 1:
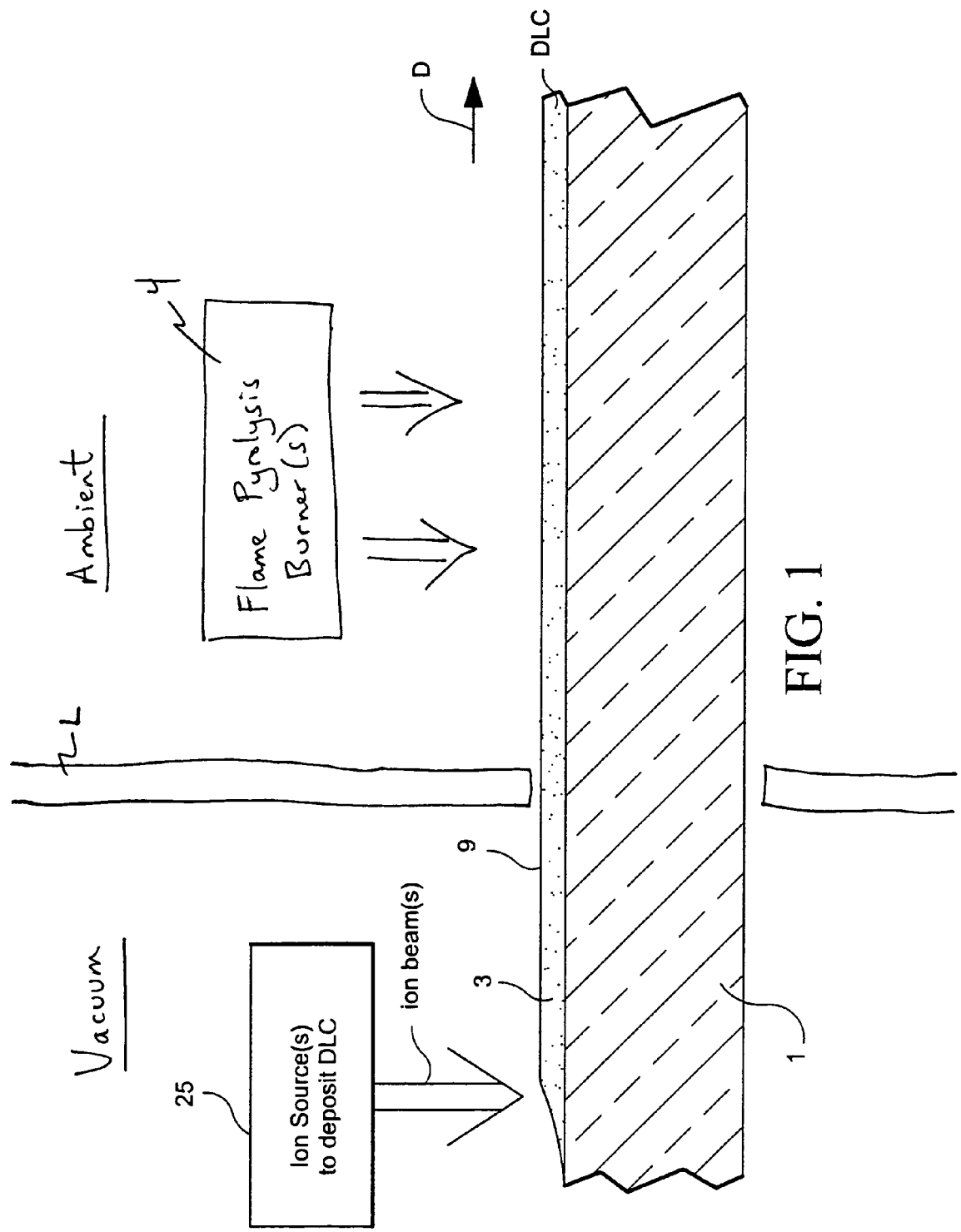
FIG. 1 is a side cross sectional view of a coated article according to an example embodiment of this invention, wherein a substrate is provided with at least a layer of or including DLC thereon and is subjected to at least a flame pyrolysis treatment in order to cause the layer's contact angle θ to decrease.

Referring now more particularly to the accompanying drawings in which like reference numerals indicate like elements/steps throughout the accompanying views.

Certain example embodiments of this invention relate to improving hydrophilic qualities of a coated article (e.g., automotive windshield, automotive backlite, automotive side window, snow-mobile windshield, architectural window, mirror, coated glass for use in furniture, etc.) by providing a diamond-like carbon (DLC) inclusive layer or coating on a substrate in a manner such that the resulting article and/or layer has hydrophilic qualities or characteristics. Certain other embodiments of this invention relate to lowering the contact angle θ of a layer comprising DLC, regardless of whether or not the final contact angle ends up rendering the coated article hydrophilic.

Surprisingly, it has been found that the contact angle θ of a layer of or including DLC can be decreased by one or more of: (a) subjecting the DLC inclusive layer to flame pyrolysis treatment after it has been deposited by ion beam deposition or the like; (b) ion beam treating the DLC layer after it has been deposited; and/or (b) hot liquid/vapor treating the DLC layer after it has been deposited. In the flame pyrolysis treatment, one or more burners may be used. Moreover, the ion beam(s) used for the ion beam treatment may be diffused, collimated, and/or focused, and one or more ion sources (and thus one or more beams) may be used for the ion beam treatment. In certain embodiments, both diffused and collimated beams may be used.

It has been found that the flame pyrolysis treatment and the ion beam treatment each increase the polar component of the DLC inclusive layer's surface energy, which in turn increases the layer's total surface energy. The higher the surface energy, the more hydrophilic the layer and the lower the contact angle θ. Thus, by increasing the surface energy via the flame pyrolysis treatment and/or ion beam treatment, the hydrophilicity of DLC can be improved and thus the contact angle θ lowered. In certain example embodiments, it has been found that subjecting the DLC inclusive layer to flame pyrolysis treatment and/or ion beam treating a DLC inclusive layer (e.g., using oxygen and nitrogen gases, and/or water vapor gas, for example, in the ion source(s)) causes the surface of the DLC inclusive layer to at least partially oxidize thereby causing its contact angle θ to quickly drop in a short period of time (e.g., in seconds or minutes, as opposed to the tens of hours required in U.S. Pat. No. 6,713,179).

In certain example embodiments, the flame pyrolysis treatment of the DLC inclusive layer causes the contact angle θ of the DLC inclusive layer to drop (decrease) at least about 5%, more preferably at least about 10%, still more preferably at least about 20%, even more preferably at least about 40%, still more preferably at least about 50%, and sometimes even at least about 60%. The contact angle θ of the DLC inclusive layer before ion beam treatment may or may not be hydrophilic, but after said ion beam treatment and/or said hot liquid/vapor treatment in certain example embodiments the contact angle θ may less than about 65 degrees, sometimes less than about 50 degrees, sometimes less than about 40 degrees, more preferably less than about 25 degrees, more preferably less than about 20 degrees, even more preferably less than about 15 degrees, and sometimes even less than about 10 degrees. In a similar manner, in certain example embodiments, the ion beam treatment of the DLC inclusive layer with at least oxygen ions causes the contact angle θ of the DLC inclusive layer to drop (decrease) at least about 5%, more preferably at least about 10%, still more preferably at least about 20%, even more preferably at least about 40%, still more preferably at least about 50%, and sometimes even at least about 60%. When both the ion beam treatment of the DLC, and the flame pyrolysis treatment of the DLC, are both performed and the ion beam treatment is performed prior to the flame pyrolysis treatment, the bulk of the reduction in contact angle may occur due to the ion beam treatment and the reduction in contact angle due to the flame pyrolysis treatment may be to a lesser extent than that discussed above.

It has also been surprisingly been found that treatment of a DLC inclusive layer with a hot liquid and/or vapor (e.g., hot water in liquid and/or vapor form) also causes the contact angle θ of the DLC inclusive layer to decrease. The hot liquid/vapor treatment may or may not be used in combination with the flame pyrolysis treatment and/or ion beam treatment in different embodiments of this invention. In certain example embodiments, the hot liquid and/or vapor treatment (e.g., using hot water) may cause the contact angle θ of the DLC inclusive layer to drop (decrease) at least about 5%, more preferably at least about 10%, still more preferably at least about 20%, even more preferably at least about 40%, still more preferably at least about 50%, and sometimes even at least about 60%.

Flame pyrolysis is typically known as a process in which combustion occurs, wherein the combustion is of at least flammable vapor(s) and/or liquid(s) which includes one or more element(s) to be deposited and/or formed on a substrate surface. The heat of the combustion (e.g., due to the flame(s)) provides needed conditions for reaction of different elements, and in certain example embodiments the substrate or film may also be heated due to the combustion flame(s) thereby creating the proper kinetic environment for a surface reaction. Examples of flame pyrolysis are disclosed in, for example and without limitation, U.S. Pat. Nos. 3,883,336, 4,600,390, 4,620,988, 5,652,021, 5,958,361, and 6,387,346, the disclosures of all of which are hereby incorporated herein by reference.

The activation of the DLC surface (i.e., to reduce the contact angle of the DLC inclusive layer) when using flame pyrolysis may be achieved due to the action of the flame at or proximate the DLC surface, by (a) surface modification of the DLC inclusive layer such as at least partially oxidizing the DLC inclusive layer's surface, and/or (b) deposition on the DLC inclusive layer of a very thin hyrophillic film (not shown). Example thin hydrophilic films which may be deposited over the DLC layer using flame pyrolysis include silicon oxide (e.g., $SiO_2$), titanium oxide (e.g., $TiO_2$), zirconium oxide, or the like. Such thin hydrophilic films may be made from the appropriate organometallic precursors, and/or may include hydrophilic organic deposits made from organic precursors (glycols, amines, polyvinyl alcohol, etc.).

For purposes of example, and without limitation, consider the follow examples of flame pyrolysis which may be used in certain embodiments of the instant invention to treat a layer comprising or consisting essentially of DLC. Hydrophilic surface modification may be achieved in certain example instances with a flame chemistry such as hydrocarbon gas plus air, as water is a by-product of the same. Another example is the use of a methane flame in air, or an oxygen rich methane flame. This may cause, for example, the surface of the DLC layer to at least partially oxidize without the formation of any additional layer over the DLC. This increases the polar component of the DLC inclusive layer's surface energy, which in turn increases the layer's total surface energy. The higher the surface energy, the more hydrophilic the layer and the lower the contact angle $\theta$.

As another example of a type of flame pyrolysis, addition of chemicals or elements that produce reactive OH (e.g., $H_2O$, $H_2O_2$, $CH_3COOH$, etc.) or NH (e.g., $NH_3$) products into a flame may be used. Such chemicals or elements may be introduced into the flame in any suitable manner, including but not limited to in gas form, liquid form, mixed with a solvent, or the like and may be introduced into the side of the flame for example. Again, this may cause for example the surface of the DLC layer to at least partially oxidize without the formation of any additional layer over the DLC. This increases the polar component of the DLC inclusive layer's surface energy, which in turn increases the layer's total surface energy. The higher the surface energy, the more hydrophilic the layer and the lower the contact angle $\theta$.

As yet another example of flame pyrolysis, a combustion gas or fuel gas such as propane, and a silicon inclusive compound such as $SiH_4$, organosilane, tetraethoxysilane (TEOS), organosiloxane, or the like, may be introduced into the flame in order to cause a very thin hydrophilic layer of silicon oxide to form over the DLC layer. Such a thin hydrophilic layer formed by flame pyrolysis over the DLC is typically no more than about 30 nm thick, more preferably no more than about 20 nm thick.

Significant example advantages associated with the use of flame pyrolysis to reduce DLC contact angle $\theta$, relative to for example a technique which uses only oxygen inclusive plasma as the last vacuum step and subsequent exposure to hot water in an exit bath, are (i) the flame pyrolysis may be used in an ambient atmosphere (i.e., atmospheric pressure) and thus need not occupy valuable and limited vacuum space, and (ii) the flame pyrolysis is a dry process with less adverse impact on second surface products which are sensitive to water contact such as when a low-E coating is provided on the other or same side of the glass substrate.

Combining the hydrophilicity with the use of an amorphous diamond-like carbon (DLC) layer/coating provided on the base substrate (e.g., glass substrate) permits the resulting coated article to have a low contact angle $\theta$ as well as surface hardness and scratch resistant characteristics sufficient such that the article may be used in automotive, window, and/or other high exposure environments where durability is desired. Optionally, polar inducing dopant(s) (e.g., B, N, P, As, S, Sb, Ga, In, and/or any other polar inducing dopant) may be provided in the DLC (in addition to the ion beam treatment) so as to help the DLC become more polar, which in turn increases surface energy and thus provides for a more hydrophilic coating. In certain optional embodiments, UV treatment may also be used to cause the contact angle $\theta$ of the DLC inclusive layer to decrease and/or stay low.

Figure 3A:
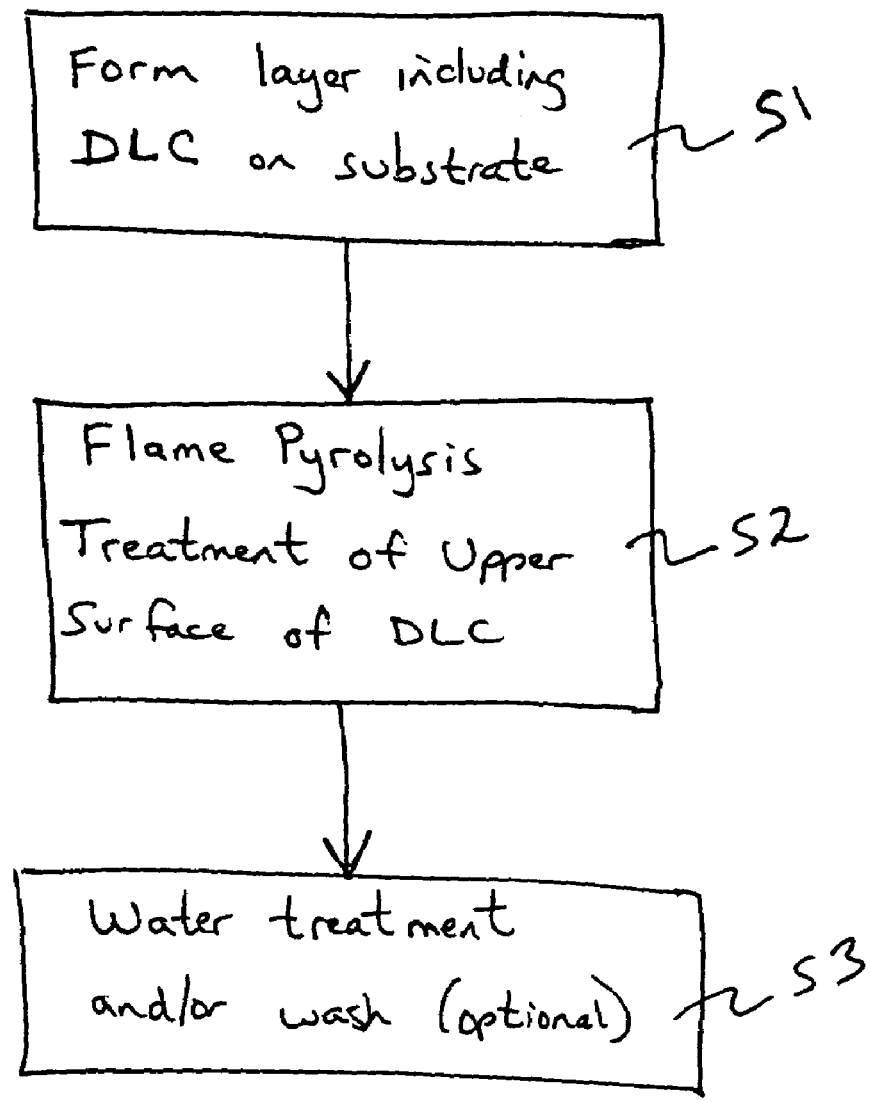
FIG. 3(a) is a flowchart according to an example embodiment of this invention, illustrating that at least flame pyrolysis treatment may be used for causing the contact angle θ of a DLC inclusive layer to decrease.
Figure 3B:
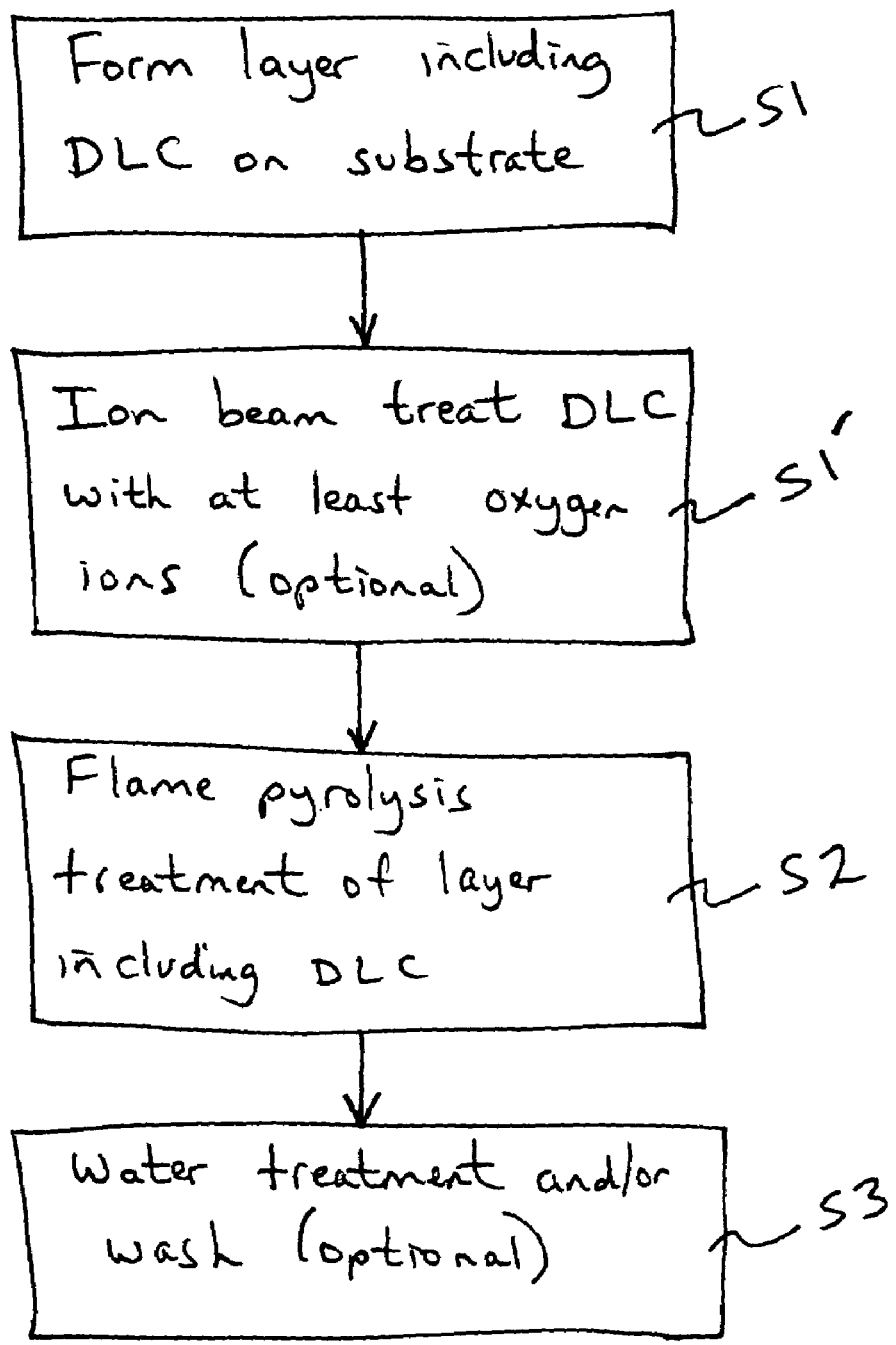
FIG. 3(b) is a flowchart according to another example embodiment of this invention, illustrating that ion beam treatment, flame pyrolysis treatment, and/or hot water treatment may be used for causing the contact angle θ of a DLC inclusive layer to decrease.

FIG. 1 is a side cross-sectional view of a coated article according to an example embodiment of this invention, wherein at least one diamond-like carbon (DLC) inclusive protective coating(s) or layer 3 is provided on substrate 1. The coated article has an exterior or outer surface 9. Substrate 1 may be of glass, plastic, ceramic, or the like. Optionally, other layer(s) (e.g., a dielectric layer(s) and/or a multi-layered low-E coating—not shown) may be provided between the DLC inclusive layer 3 and the substrate 1 in certain embodiments of this invention. FIG. 1 illustrates that as the coated substrate moves in direction D, the DLC layer 3 is subjected to flame pyrolysis treatment by a bank of one or more flame pyrolysis burner(s) 4. FIG. 2 is similar to FIG. 1, except that in the FIG. 2 embodiment a hot water treatment may be performed on the DLC inclusive layer 3 in addition to the flame pyrolysis treatment. While FIGS. 1-2 illustrates the ion source 25 for depositing the DLC layer 3, the DLC layer 3 itself, and the flame pyrolysis burner(s) on the top side of the substrate 1, these components and layer may instead be on the bottom side of the substrate in certain example embodiments of this invention. FIG. 3($a$) is a flowchart illustrating steps taken in order to reduce the contact angle $\theta$ of the DLC layer 3 in certain embodiments of this invention.

Referring to FIGS. 1, 2 and 3($a$), layer 3 comprising DLC may be ion beam deposited on substrate 1 using an ion beam(s) from ion source(s) 25 in a vacuum environment having a pressure less than atmospheric (see S1 in FIG. 3($a$)). Optionally, other layer(s) may be on the substrate under the DLC layer 3. The term "on" (with regard to a layer being "on" a substrate or other layer) herein means supported by, regardless of whether or not other layer(s) are provided therebetween, and regardless of which side of the substrate the layer is located. Thus, for example, DLC inclusive layer 3 may be provided directly on substrate 1 as shown in FIG. 1, or may be provided on substrate 1 with a low-E coating or other layer(s) therebetween. Example layer systems (in full or any portion of these coatings) that may be used as low-E or other coating(s) on substrate 1 between DLC layer 3 and the substrate are shown and/or described in any of U.S. Pat. Nos. 5,837,108, 5,800,933, 5,770,321, 5,557,462, 5,514,476, 5,425,861, 5,344,718, 5,376,455, 5,298,048, 5,242,560, 5,229,194, 5,188,887, 3,682,528, 5,011,745, WO 02/04375 (U.S. Ser. No. 09/794,224) and U.S. Pat. No. 4,960,645, which are all hereby incorporated herein by reference. These optional coatings are provided for purposes of example and are not intended to be limiting.

As deposited, the layer 3 comprising DLC may be deposited as any of the DLC inclusive layer(s) in any of U.S. Pat. Nos. 6,303,226 and/or 6,303,225 (both hereby incorporated herein by reference), or in any other suitable manner/form. Thus, the layer 3 comprising DLC may have more $sp^3$ carbon-carbon bonds than sp carbon-carbon bonds either throughout the entire layer and/or in at least one 10 angstrom (Å) thick portion thereof. Moreover, the DLC layer 3 is preferably entirely or at least partially amorphous and may or may not be hydrogenated in certain embodiments. For example, the DLC layer 3 may include from about 1-25% H in certain embodiments, more preferably from about 5-20% H, and most preferably from about 7-18% H in certain embodiments of this invention. In certain embodiments, DLC layer 3 may be from about 10 to 1,000 Angstroms thick, more preferably from about 50 to 250 Angstroms thick. Moreover, in certain exemplary embodiments of this invention, layer 3 has an average hardness of at least about 10 GPa, more preferably of at least about 20 GPa, and even more preferably of at least about 50 GPa. Also, the DLC layer 3 may have an average density of at least about 2.4 grams/cm$^2$ (more preferably from about 2.5 to 3.0 grams/cm$^2$) in certain example embodiments of this invention.

After the DLC inclusive layer 3 is deposited on the substrate 1 using ion source(s) 25 in a vacuum atmosphere (i.e., at a pressure less than atmospheric pressure) in SI, the coated substrate moving in direction D exits the in-line coater via load lock L, and travels past one or more flame pyrolysis burners 4 for flame pyrolysis treatment (see S2 in FIG. 3(*a*)). The burner(s) 4 may cause any of the flame pyrolysis treatments discussed herein to be performed on the DLC inclusive layer 3, thereby causing its contact angle to be decreased as explained herein.

Optionally, as shown in FIG. 2, in addition and subsequent to the flame pyrolysis treatment, the surface 9 of the DLC inclusive layer 3 may be treated with a hot liquid and/or vapor at area 20 in order to cause its contact angle θ to further decrease (see S3 in FIG. 3(*a*)). In an example embodiment of this invention, the surface 9 of the DLC layer 3 is exposed to hot water (in liquid and/or vapor form). In certain example embodiments, the hot water may be at a temperature of from 50 to 200 degrees C., more preferably from about 70 to 200 degrees C., even more preferably from about 80 to 150 degrees C. It has been found that temperatures lower than this do not result in the desired contact angle reduction of surface 9 of DLC layer 3. This hot water treatment may be combined with a washing step in certain example embodiments of this invention.

After being treated with flame pyrolysis in order to reduce contact angle, the coated article is packaged and processed as is regular glass in certain example embodiments of this invention.

The flowchart of FIG. 3(*b*) illustrates another example embodiment of this invention. In particular, referring to FIGS. 1-2 and 3(*b*), prior to subjecting the DLC layer 3 to flame pyrolysis treatment, the outer surface 9 of the DLC inclusive layer 3 (i.e., the surface farthest from the substrate 1) may first be ion beam treated using at least one ion source (and thus at least one ion beam) in order to cause the contact angle θ of the layer 3 to decrease (see step S1' in FIG. 3(*b*)). This ion treatment may take place as the coated substrates moves in direction D under one or more ion source(s), or alternatively while the substrate remains still and the ion source(s) move with respect thereto. When oxygen and/or nitrogen gas are used in the ion beam source(s) for example, the ion beam treatment of the surface 9 of the coated article causes the outer surface of the layer 3 to at least partially oxidize thereby causing the contact angle to quickly drop (optionally, oxygen with no nitrogen may instead be used as a gas in the ion source which generates the ion beam). This ion beam treatment may be performed in the vacuum area of the coating apparatus, which is at a pressure less than atmospheric (i.e., before the coated article exits via the load lock). The use of oxygen gas (optionally with N, H, and/or other gas) causes the resulting ion beam(s) that is directed toward surface 9 to include $O_2^-$, $O^-$ and/or $OH^-$ ions (ions including at least oxygen ions). One or more of these ions hit the surface 9 of the DLC inclusive layer 3 and cause its contact angle θ to drop. Presumably, the contact angle drops because C=O—H, C=O, and/or C—O bonds (i.e., oxygen-carbon bonds and/or oxygen-hydrogen-carbon bonds) form at the surface 9 of the DLC inclusive layer 3 thereby causing its surface energy to rise. In other words, the ion beam treatment introduces oxygen to the surface 9 of the DLC inclusive layer 3, which is believed to be a primary reason why the contact angle is caused to quickly drop. By tuning the gas composition, ion energy, and throw distance in the beam(s), one may be able to run such a treating process at speeds of 100 in./minute or more, and still achieve hydrophilic surface(s). Oxygen is a preferred example gas to be used in a treating ion beam source(s), although other gases may be used instead of or in addition to oxygen in different embodiments of this invention so long as they cause the contact angle to decrease. When N is used in a gas in one or more of the ion beam source(s) for the ion beam treatment (e.g., in combination with oxygen and/or hydrogen gas), the resulting N ions tend to make the surface of DLC layer 3 more electrically conductive than the glass which may be desirable in some instances. In other embodiments, water vapor may be used as a feed gas in at least one of the ion beam treating source(s). Resulting ions can end up being subimplanted in the surface of layer 3, and the polar nature of these ions/molecules when water vapor gas is used can significantly reduce the static potential which can attract dust particles thereby enabling the coating to be more resistant to dust accumulation. In still other embodiments, the ion treatment may use $H_2O_2$ gas in at least one of the ion beam sources used for the treating. Again, the $O_2^-$, $O^-$ and/or $OH^-$ ions hit the surface 9 of the DLC inclusive layer 3 and cause contact angle θ to drop as discussed above. Other gases may also be used in other embodiments of this invention. It is noted that the ion beam treatment, while causing the contact angle of layer 3 to decrease, may cause some portion (e.g., 0-20 angstroms) of the layer 3 to be removed during the ion beam treatment process. Thus, it will be appreciated that various gas(es) may be used in an ion source(s) for generating an ion beam(s) including oxygen for treating the surface of the DLC inclusive layer, with example gases including, but not limited to, $O_2$, $H_2O$, $H_2O_2$, $N_2O$, $CO_2$, and/or the like. The angle a at which the ion beam(s) hits the surface 9 of DLC inclusive layer 3 during the ion beam treatment may be from about 1-90 degrees in different embodiments of this invention. However, in certain embodiments, the angle a that the beam(s) makes with the surface 9 of the coated article may be from about 30-60 degrees, most preferably from about 40-50 degrees.

In certain example embodiments (e.g., see FIGS. 1-2), the coated article including the treated DLC inclusive layer 3 (and optionally other layer(s) such as the low-E coating) on substrate 1 may be at least about 50% transparent to or transmissive of visible light rays, more preferably at least 70%, and even more preferably at least about 75%. When substrate 1 is of glass, the glass may be from about 1.5 to 5.0 mm thick.

Conventional soda lime silica glass may be used as substrate 1 in certain embodiments, such glass being commercially available from Guardian Industries, Corp., Auburn Hills, Mich. In certain other embodiments of this invention, substrate 1 may be of borosilicate glass, or of substantially transparent plastic.

Figure 4:
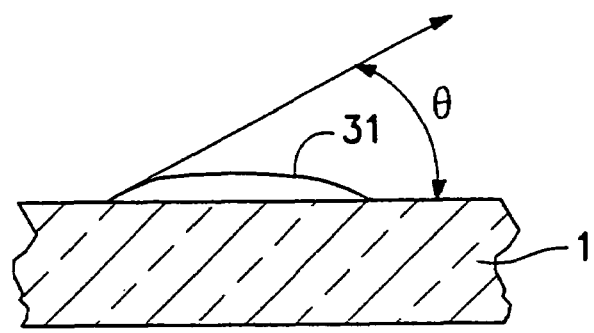
FIG. 4 is a side cross sectional partially schematic view illustrating a contact angle θ of a drop (e.g., sessile drop of water) on an uncoated glass substrate.
Figure 5:
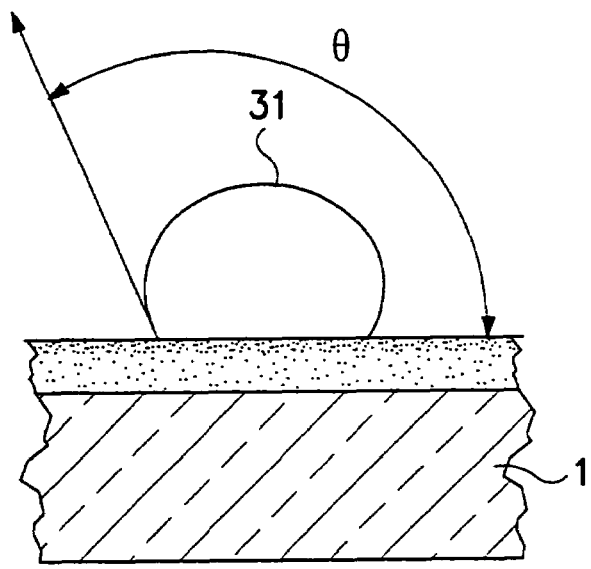
FIG. 5 is a side cross sectional partially schematic view illustrating a high contact angle θ of a drop on a coated article including a hydrophobic coating of, for example, an article disclosed in U.S. patent application Ser. No. 09/442,805.
Figure 6:
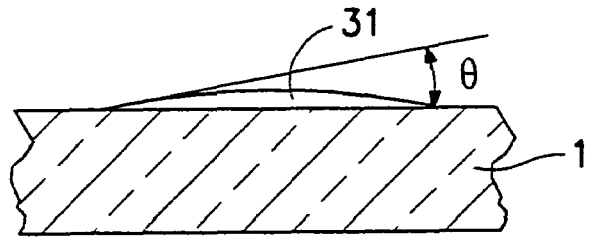
FIG. 6 is a side cross sectional partially schematic view illustrating a low contact angle θ of a drop (e.g., sessile drop of water) on a coated article according to an example embodiment of this invention (following one or more of flame pyrolysis treatment, ion beam treatment and/or hot liquid treatment).

Hydrophilic performance of coating/layer 3 in any of the above embodiments is a function of contact angle θ, surface energy γ, and/or wettability or adhesion energy W. The surface energy γ of layer 3 may be calculated by measuring its contact angle θ. Exemplary contact angles θ are illustrated in FIGS. 4-6. A hydrophilic coating or layer system 3 according to an embodiment of this invention is on the substrate of FIG. 6 (i.e., low contact angle θ), while no coating of any kind is on the substrate of FIG. 4 and a hydrophobic coating (high contact angle) is on the substrate of FIG. 5. No coatings are illustrated in FIGS. 4 and 6 for purposes of simplicity. To measure contact angle θ in an example embodiment, a sessile drop 31 of a liquid such as water is placed on the substrate (which may be coated) as shown in FIGS. 4-6. A contact angle θ between the drop 31 and underlying article appears, defining an angle θ depending upon the interface tension between the three phases at the point of contact. The contact angle θ is greater in FIG. 5 than in FIG. 4, because the coating layer on the substrate in FIG. 5 is hydrophobic (i.e., results in a higher contact angle). However, in certain embodiments of this invention, the contact angle θ in FIG. 6 is low due to the flame pyrolysis treatment, ion beam treatment and/or hot water treatment of the DLC inclusive layer 3 that is on the substrate 1.

Generally, the surface energy $\gamma_c$ of a layer 3 or any other article/layer can be determined by the addition of a polar and a dispersive component, as follows: $\gamma_c = \gamma_{CP} + \gamma_{CD}$, where $\gamma_{CP}$ is the layer's/coating's polar component and $\gamma_{CD}$ the layer's/coating's dispersive component. The polar component of the surface energy represents the interactions of the surface mainly based on dipoles, while the dispersive component represents, for example, van der Waals forces, based upon electronic interactions. Generally speaking, the higher the surface energy $\gamma_c$ of layer 3, the more hydrophilic the layer (and coated article) and the lower the contact angle θ. Adhesion energy (or wettability) W can be understood as an interaction between polar with polar, and dispersive with dispersive forces, between the exterior surface 9 of the coated article and a liquid thereon such as water. For a detailed explanation, see U.S. Pat. No. 6,713,179 (incorporated herein by reference). In certain example embodiments of this invention, after flame pyrolysis treatment, ion beam treatment and/or hot water treatment of the DLC inclusive layer 3, the surface energy $\gamma_C$ of layer 3 may be at least about 20 mN/m, more preferably at least about 24 mN/m, and most preferably at least about 26 mN/m.

Figure 7:
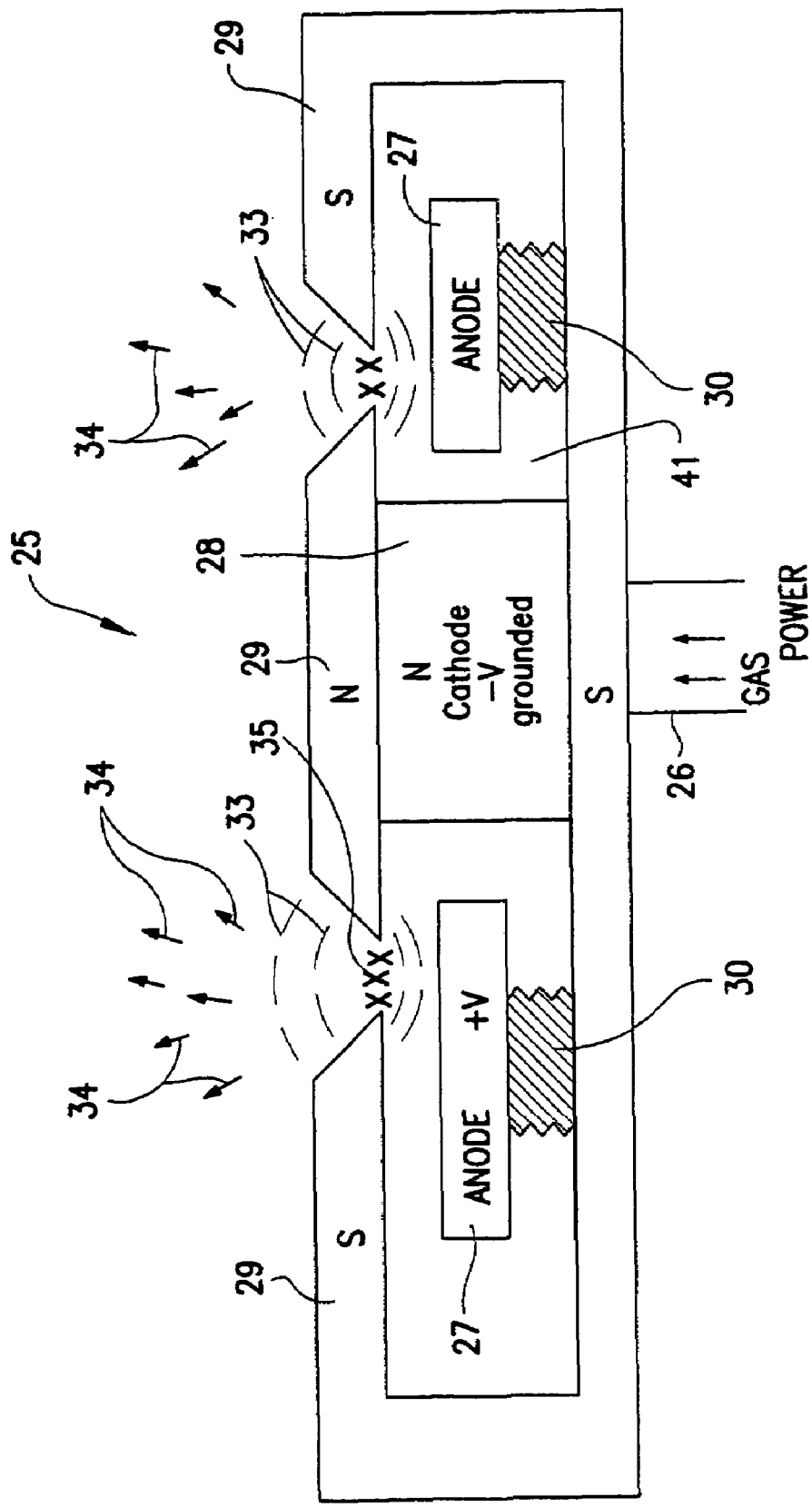
FIG. 7 is a side cross sectional view of an example ion beam source which may be used in any embodiment of this invention for depositing a DLC inclusive layer(s) and/or for ion beam treating a layer of or including DLC in order to cause its contact angle θ to decrease.
Figure 8:
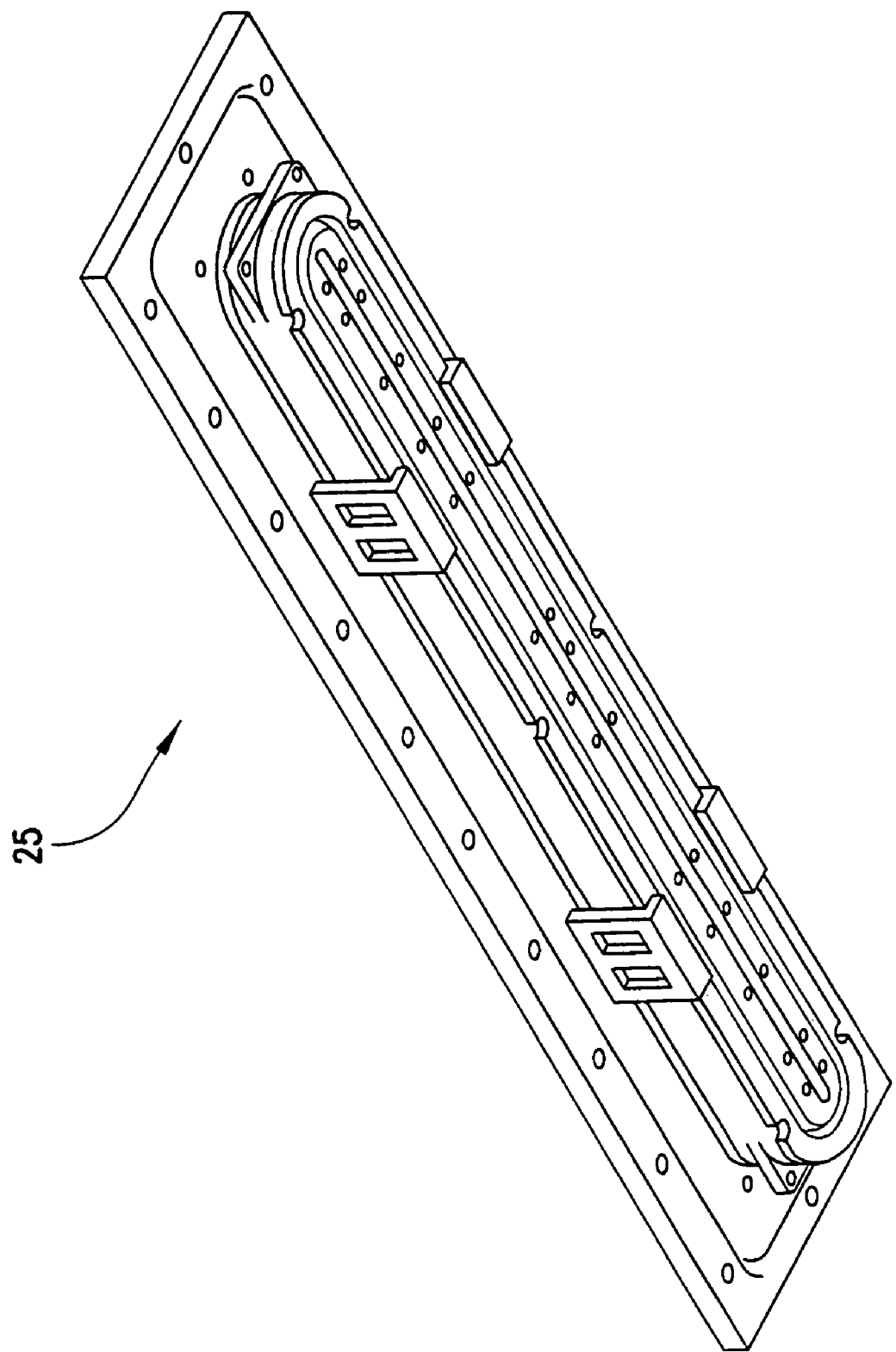
FIG. 8 is a perspective view of the linear ion beam source of FIG. 7.

FIGS. 7-8 illustrate an exemplary linear or direct ion beam source 25 which may be used to deposit layer(s) 3, clean a substrate 1 before depositing layer 3, and/or ion beam treat the surface 9 of DLC inclusive layer 3 with at least oxygen ions to reduce its contact angle θ. Ion beam source (or ion source) 25 includes gas/power inlet 26, racetrack-shaped anode 27, grounded cathode magnet portion 28, magnet poles 29, and insulators 30. An electric gap is defined between the anode 27 and the cathode 29. A 3 kV or any other suitable DC power supply may be used for source 25 in some embodiments. The oxygen and/or other gas(es) discussed herein for use in the ion source during the ion beam treatment, DLC deposition, or the like may be introduced into the source via gas inlet 26, or via any other suitable location. Linear source ion deposition allows for substantially uniform deposition of DLC inclusive layer 3 as to thickness and stoichiometry. Ion beam source 25 is based upon a known gridless ion source design. The linear source may include a linear shell (which is the cathode and grounded) inside of which lies a concentric anode (which is at a positive potential). This geometry of cathode-anode and magnetic field 33 may give rise to a close drift condition. Feedstock gases (e.g., oxygen inclusive gas as discussed above used in ion beam treating surface 9 to make contact angle drop, or $C_2H_2$ used for DLC deposition) may be fed through the cavity 41 between the anode 27 and cathode 29. The voltage used between the anode 27 and cathode 29 during ion beam treatment of surface 9 with at least oxygen ions is preferably at least 800 V, more preferably at least 1,000 V, and most preferably from about 1,000 to 2,000 V. Moreover, during such ion beam treatment, the oxygen inclusive gas in the source may be provided in terms of a gas flow of from about 100 to 200 sccm in certain example embodiments of this invention, more preferably from about 135 to 180 sccm. The electrical energy between the anode and cathode then cracks the gas to produce a plasma within the source. The ions 34 are expelled out and directed toward the substrate 1 in the form of an ion beam. The ion beam may be diffused, collimated, or focused. Example ions 34 are shown in FIG. 7. A linear source as long as 0.5 to 4 meters may be made and used in certain example instances, although sources of different lengths are anticipated in different embodiments of this invention. Electron layer 35 is shown in FIG. 7 and completes the circuit. Example but non-limiting ion beam sources that may be used to deposit layer 3 and/or to ion beam treat the same to cause its contact angle to drop are disclosed in U.S. Pat. Nos. 6,303,226, 6,359,388, 6,037,717, and 5,656,891, all of which are hereby incorporated herein by reference. For purposes of example only, DLC inclusive layer 3 may be ion beam deposited on substrate 1 using source 25 of FIGS. 7-8 in a manner(s) described in any of U.S. Pat. Nos. 6,303,225, 6,303,226, 6,368,664, and/or 6,359,388, all of which are incorporated herein by reference. A hydrocarbon feedstock gas such as $C_2H_2$ may be used in the source in order to ion beam deposit the DLC inclusive layer 3. When it is desired to hydrogenate layer 3, for example, a dopant gas may be produced by bubbling a carrier gas (e.g. $C_2H_2$) through a precursor monomer (e.g. TMS or 3MS) held at about 70 degrees C. (well below the flashing point). Acetylene feedstock gas ($C_2H_2$) is used in certain embodiments to prevent or minimize/reduce polymerization and to obtain an appropriate energy to allow the carbon and/or hydrogen ions to penetrate the article and subimplant therein, thereby causing the layer 3 to grow. Other suitable gases, including polar inducing dopant gases, may also be used in the source to create the ions 34. After the DLC inclusive layer 3 has been deposited (via ion beam deposition or any other suitable technique), its surface is ion beam treated and/or hot water treated as discussed above in order to decrease its contact angle. It is believed that the ion beam treatment and/or hot water treatment results in oxidation and causes a thin carbon-oxide layer/portion to form at the surface of the layer 3 (e.g., including C=O and/or O—C=O bonds, discussed above for example). This thin at least partially oxidized surface layer portion has a fair amount of attraction to water molecules (polar bonds), thus explaining its hydrophilicity. This thin carbon oxide inclusive layer/portion may be from about 1-30 Å thick, more likely/preferably about 5-15 Å thick. This thin carbon oxide inclusive portion is believed to seal off the remainder of the layer 3 from the ambient atmosphere, so as to prevent further oxidation (i.e., the bulk of the hard $sp^3$ carbon-carbon bonds in the bulk of the layer 3 are thus resistant to oxidation so that the layer maintains its scratch resistance and the like). This sealing off prevents degradation of the bulk of layer 3, while at the same time providing hydrophilic properties (i.e., low contact angle) at the surface thereof.

Once given the above disclosure, many other features, modifications, and improvements will become apparent to the skilled artisan. For example, layers of other materials may be used instead of diamond-like carbon, so that the flame pyrolysis can be used to reduce contact angle of layers of other materials. Such other features, modifications, and improvements are, therefore, considered to be a part of this invention, the scope of which is to be determined by the following claims.

What is claimed is:

1. A method of making a coated article, the method comprising:
    depositing a layer comprising diamond-like carbon (DLC) on a substrate; after said depositing, subjecting the layer comprising DLC to a flame pyrolysis treatment in order to reduce a contact angle $\theta$ of the layer comprising DLC.

2. The method of claim 1, further comprising, after subjecting the layer comprising DLC to the flame pyrolysis treatment, treating the layer comprising DLC with a hot liquid and/or vapor at a temperature of from about 50 to 200 degrees C.

3. The method of claim 1, further comprising, prior to the flame pyrolysis treatment, ion beam treating the layer comprising DLC with at least oxygen ions in order to reduce contact angle $\theta$ of the layer comprising DLC.

4. The method of claim 1, wherein the flame pyrolysis treatment causes the contact angle $\theta$ of the layer comprising DLC to decrease by at least about 20%.

5. The method of claim 1, wherein the flame pyrolysis treatment causes the contact angle $\theta$ of the layer comprising DLC to decrease by at least about 40%.

6. The method of claim 1, wherein the flame pyrolysis treatment causes the contact angle $\theta$ of the layer comprising DLC to decrease by at least about 50%.

7. The method of claim 1, wherein the flame pyrolysis treatment causes the contact angle $\theta$ of the layer comprising DLC to decrease by at least about 60%.

8. The method of claim 1, wherein the layer comprising DLC has an average hardness of at least 10 GPa.

9. The method of claim 1, wherein after said flame pyrolysis treatment, the layer comprising DLC has a contact angle $\theta$ of less than or equal to 25 degrees.

10. The method of claim 1, wherein after said flame pyrolysis treatment, the layer comprising DLC has a contact angle $\theta$ of less than or equal to 20 degrees.

11. The method of claim 1, wherein after said flame pyrolysis treatment, the layer comprising DLC has a contact angle $\theta$ of less than or equal to 15 degrees.

12. The method of claim 1, wherein after said flame pyrolysis treatment, the layer comprising DLC has a contact angle $\theta$ of less than or equal to 10 degrees.

13. The method of claim 1, wherein the layer comprising DLC is amorphous.

14. The method of claim 1, wherein the layer comprising DLC is hydrogenated.

15. The method of claim 1, wherein the layer comprising DLC has more $sp^3$ carbon-carbon bonds than $sp^2$ carbon-carbon bonds, and has an average density of at least about 2.4 grams/cm$^2$.

16. The method of claim 1, further comprising ion beam treating the layer comprising DLC prior to said flame pyrolysis treatment, and wherein said ion beam treating comprises using at least one ion beam source that generates at least one ion beam toward a surface of the layer comprising DLC, and wherein at least oxygen gas is present in the ion beam source during the ion beam treating so that at least oxygen ions are directed toward the surface of the layer comprising DLC during said ion beam treating.

17. The method of claim 1, further comprising sputtering a low-E coating onto the substrate before depositing the layer comprising DLC, where the low-E coating is on either the same or opposite side of the substrate as the layer comprising DLC, and wherein the substrate is a glass substrate.

18. The method of claim 1, wherein the flame pyrolysis treatment comprises using a methane flame in air proximate the layer comprising DLC.

19. The method of claim 1, wherein the flame pyrolysis treatment comprises providing a flame proximate the layer comprising DLC, and introducing a gas or liquid into the flame, where the gas or liquid comprises oxygen and/or hydrogen.

20. The method of claim 1, wherein the flame pyrolysis treatment comprises providing a flame proximate the layer comprising DLC, and introducing a gas or liquid into the flame, where the gas or liquid comprises silicon and/or hydrogen.

21. The method of claim 1, wherein the flame pyrolysis treatment causes an outer surface of the layer comprising DLC to oxidize.

22. The method of claim 1, wherein the flame pyrolysis treatment causes an outer surface of the layer comprising DLC to oxidize, but does not cause another layer to be formed on the layer comprising DLC.

23. The method of claim 1, wherein the flame pyrolysis treatment causes a thin hydrophilic layer to be formed on the layer comprising DLC.

24. The method of claim 23, wherein the thin hydrophilic layer comprises silicon oxide, titanium oxide, or zirconium oxide.

25. The method of claim 1, wherein the flame pyrolysis is performed in an atmosphere at atmospheric pressure.

26. The method of claim 1, wherein a plurality of burners are used in the flame pyrolysis treatment.

27. The method of claim 1, wherein the layer comprising DLC is ion beam deposited on the substrate.

28. The method of claim 1, wherein the substrate is a glass substrate.

29. A window made using at least the method of claim 1.

30. A method of making a coated article, the method comprising:
    subjecting a layer comprising diamond-like carbon (DLC) to a flame pyrolysis treatment in order to reduce a contact angle $\theta$ of the layer comprising diamond-like carbon (DLC), the layer comprising DLC being provided on a substrate.

31. The method of claim 30, wherein the flame pyrolysis treatment causes the contact angle $\theta$ of the layer to decrease by at least about 20%.

32. The method of claim 30, wherein the flame pyrolysis treatment causes the contact angle $\theta$ of the layer to decrease by at least about 50%.

33. The method of claim 30, wherein after said flame pyrolysis treatment, the layer has a contact angle $\theta$ of less than or equal to 20 degrees.

34. The method of claim 30, wherein after said flame pyrolysis treatment, the layer has a contact angle $\theta$ of less than or equal to 10 degrees.

35. The method of claim 30, wherein the substrate comprises glass.

* * * * *